(12) United States Patent
Tamagaki et al.

(10) Patent No.: US 7,955,722 B2
(45) Date of Patent: Jun. 7, 2011

(54) PROTECTIVE ALUMINA FILM AND PRODUCTION METHOD THEREOF

(75) Inventors: Hiroshi Tamagaki, Takasago (JP); Toshimitsu Kohara, Takasago (JP)

(73) Assignee: Kobe Steel, Ltd., Kobe-shi (JP)

( * ) Notice: Subject to any disclaimer, the term of this patent is extended or adjusted under 35 U.S.C. 154(b) by 1037 days.

(21) Appl. No.: 10/554,601

(22) PCT Filed: Mar. 16, 2004

(86) PCT No.: PCT/JP2004/003493
§ 371 (c)(1),
(2), (4) Date: Oct. 27, 2005

(87) PCT Pub. No.: WO2004/097062
PCT Pub. Date: Nov. 11, 2004

(65) Prior Publication Data
US 2006/0263640 A1 Nov. 23, 2006

(30) Foreign Application Priority Data
Apr. 30, 2003 (JP) ................................ 2003-125518

(51) Int. Cl.
*B32B 15/04* (2006.01)
*C23C 14/06* (2006.01)
(52) U.S. Cl. ........ 428/701; 428/469; 428/702; 428/212; 428/216; 428/697; 427/255.19; 427/248.1
(58) Field of Classification Search .................. None
See application file for complete search history.

(56) References Cited

U.S. PATENT DOCUMENTS

| 4,844,951 | A | * | 7/1989 | Sarin et al. ............... 427/255.19 |
| 5,478,634 | A | * | 12/1995 | Setoyama et al. ............ 428/216 |
| 5,503,912 | A | * | 4/1996 | Setoyama et al. ............ 428/216 |
| 6,071,601 | A | * | 6/2000 | Oshika et al. ............... 428/216 |
| 6,333,099 | B1 | * | 12/2001 | Strondl et al. ............... 428/216 |
| 2005/0058850 | A1 | | 3/2005 | Kohara et al. |
| 2005/0276990 | A1 | | 12/2005 | Kohara et al. |
| 2006/0006059 | A1 | * | 1/2006 | Kohara et al. |
| 2006/0014041 | A1 | * | 1/2006 | Kohara et al. |
| 2006/0257562 | A1 | * | 11/2006 | Tamagaki et al. |
| 2008/0240876 | A1 | * | 10/2008 | Elkouby et al. ............... 407/119 |

FOREIGN PATENT DOCUMENTS

DE  34 27 456 A1  1/1986

(Continued)

OTHER PUBLICATIONS

JP2002-053946 computer generated English translation, Feb. 19, 2002.*
Ashenford et al. "Experimental and theoretical studies of the low-temperature growth of chromia and alumina", Surface and Coatings Technology, vol. 116-119, pp. 699-704, 1999.

*Primary Examiner* — Aaron Austin
(74) *Attorney, Agent, or Firm* — Oblon, Spivak, McClelland, Maier & Neustadt, L.L.P.

(57) ABSTRACT

Provided is a protective alumina film mainly containing alumina in the α-crystal structure and fine crystal grains in which one or more regions containing additionally an element other than aluminum formed along the planes in the direction almost perpendicular to the thickness direction of the protective film are present intermittently in the thickness direction inside the protective film.

7 Claims, 6 Drawing Sheets

FOREIGN PATENT DOCUMENTS

| | | |
|---|---|---|
| DE | 195 18 781 C1 | 9/1996 |
| DE | 198 15 677 A1 | 10/1999 |
| EP | 0 878 563 A1 | 11/1998 |
| EP | 1705263 A1 * | 9/2006 |
| JP | 64 083667 | 3/1989 |
| JP | 10 076406 | 3/1998 |
| JP | 2001 335917 | 12/2001 |
| JP | 2001 342556 | 12/2001 |
| JP | 2002 053946 | 2/2002 |
| JP | 2004 076029 | 3/2004 |

* cited by examiner

PROTECTIVE ALUMINA FILM AND PRODUCTION METHOD THEREOF

CROSS REFERENCE TO RELATED APPLICATIONS

This application is a national stage entry of PCT/JP04/03493, filed Mar. 16, 2004, which claims the benefit of priority from Japanese Patent Application No. 2003-125518, filed Apr. 30, 2003.

FIELD OF THE INVENTION

The present invention relates to a protective film mainly containing alumina in the α-crystal structure (hereinafter, referred to simply as "α-alumina") that is coated on wear-resistant products such as cutting tools, sliding parts, dies and the like, and a production method thereof, and in particular to a protective alumina film containing fine crystal grains of α-alumina and a production method of forming the protective alumina film on a base material or an undercoat film under a low-temperature condition without damaging the properties thereof.

Although the protective alumina film obtained by the present invention can be applied to the various applications described above, the invention will be described hereinafter, applying it mainly to a cutting tool as a typical example.

BACKGROUND OF THE INVENTION

Generally, base material, for example of high-speed steel or cemented carbide, having a hard film such as of titanium nitride or titanium aluminum nitride formed on the surface thereof by physical vapor deposition method (hereinafter, referred to as PVD method), chemical vapor deposition method (hereinafter, referred to as CVD method), or the like have been used as cutting tools and sliding parts, for which superior wear resistance and sliding property are demanded.

In particular, for application as a cutting tool, the hard film thereon should have high wear resistance and heat resistance (oxidation resistance at high temperature), and thus, titanium aluminum nitride (TiAlN), which is superior in both of these properties, has been used widely as a coating material for applications such as cemented carbide tools, the edge of which becomes heated to high temperature during cutting. The reason for such superior properties of TiAlN is that the TiAlN film is improved in heat resistance by the action of aluminum contained in the film and exhibits high wear and heat resistance consistently up to a high temperature of approximately 800° C. Various TiAlN compounds different in the composition ratio of Ti to Al have been used as the TiAlN's, but most of them have a composition at a Ti:Al atomic ratio in the range of 50:50 to 25:75, in which the TiAlN is superior in both properties.

Meanwhile, the edge, for example, of a cutting tool becomes heated occasionally to a temperature of 1,000° C. or higher during cutting. Under such circumstance, because the TiAlN film alone is not satisfactory as it is for ensuring sufficient heat resistance, an alumina layer is formed additionally on the TiAlN film for ensuring heat resistance, as disclosed, for example, in U.S. Pat. No. 5,879,823.

Alumina has various crystal structures depending on temperature, but any of the crystal structures except α-crystal structure is in the thermally metastable state. However, as in the case of a cutting tool, when the edge temperature during cutting fluctuates in a wide range from room temperature to 1,000° C. or higher, the crystal structure of alumina changes, causing problems such as cracking and delamination of film. However, alumina in the α-crystal structure once formed by CVD at a higher substrate temperature of 1,000° C. or more retains its thermally stable structure, independently of the temperature thereafter. Thus, coating of an alumina film in the α-crystal structure is considered as an effective means of adding heat resistance to cutting tools and others.

However as described above, it is necessary to heat the substrate to 1,000° C. or higher to form alumina in the α-crystal structure, which restricts the kinds of base materials applicable. It is because the base material may soften and lose its favorable qualities as a substrate for wear-resistant products depending on its kind, when exposed to a high temperature of 1,000° C. or higher. In addition, even high heat-resistant base materials, such as cemented carbides, also cause problems such as deformation, when exposed to such a high temperature. Practical temperature range for use of the hard films, such as TiAlN film, formed on a base material as an wear-resisting film is generally approximately 800° C. at the highest, and the film may decompose and lead to deterioration in wear resistance when exposed to a high temperature of 1,000° C. or higher To overcome such problems, U.S. Pat. No. 5,310,607 reported that a composite $(Al,Cr)_2O_3$ crystal having a hardness at the same level as that of the alumina described above was obtained in a low-temperature range of 500° C. or lower. However, if the work material is a material containing iron as the principal component, Cr existing on the surface of the composite crystal film often reacts chemically with iron in the work material during cutting, causing enhanced consumption of the film and reduction of the lifetime.

Alternatively, O. Zywitzki, G.Hoetzsch, et al. reported in "Surf Coat. Technol." (86-87, 1996, pp. 640-647) that it was possible to form an aluminum oxide film in the α-crystal structure at 750° C. by reactive sputtering by using a pulsed power supply at a high output (of 11 to 17 kW). However, it is inevitable to expand the size of the pulsed power supply for obtaining aluminum oxide in the α-crystal structure by this method.

As a method for overcoming such problems, Japanese Unexamined Patent Publication No. 2002-53946 discloses a method of using an oxide film in corundum structure (α-crystal structure) having a lattice parameter of 4.779 Å or more and 5.000 Å or less and a film thickness of at least 0.005 μm as an underlayer and forming an alumina film in the α-crystal structure on the underlayer. It was indicated there that the component for the oxide film is preferably $Cr_2O_3$, $(Fe,Cr)_2O_3$ or $(Al,Cr)_2O_3$; when the component for the oxide film is $(Fe,Cr)_2O_3$, it is more preferably $(Fe_x,Cr_{(1-x)})_2O_3$ (wherein, $0 \leq x \leq 0.54$); and when the component for the oxide film is $(Al,Cr)_2O_3$, it is more preferably $(Al_y,Cr_{(1-y)})_2O_3$ (wherein, $0 \leq y \leq 0.90$).

The Japanese Unexamined Patent Publication No. 2002-53946 above also disclosed that it was effective to form a film of a composite nitride of Al and one or more elements selected from the group consisting of Ti, Cr, and V as a hard film and additionally as an intermediate layer an oxide film having the corundum structure (α-crystal structure) by oxidizing a film of $(Al_z,Cr_{(1-z)})N$ (wherein, $0 \leq z \leq 0.90$) and then form alumina in the α-crystal structure on the oxide film.

As described above, it is possible to form an alumina film almost only in the α-crystal structure according to the method described in the Japanese Unexamined Patent Publication No. 2002-53946, but the inventors have found that the method often causes growth to coarse crystal grains in the alumina film, from the following experiments:

According to the method described in Japanese Unexamined Patent Publication No. 2002-53946, a CrN film was formed on cemented carbide, the surface thereof was oxidized, and an alumina film was formed on the oxidized CrN film surface, and the alumina film obtained was observed.

More specifically, a sample 2 in which a CrN film was formed on a cemented carbide base material by ion plating method (AIP method) was prepared, and the sample was connected to the planetary revolving jig 4 and heated to 750° C. with the heaters 5 after the chamber 1 was evacuated to almost vacuum state in the device shown in FIG. 1.

When the sample 2 is heated to a predetermined temperature, an oxygen gas was introduced into the chamber 1 at a flow rate of 300 sccm to a pressure of approximately 0.75 Pa, and the sample 2 was oxidized while heated for 20 minutes.

Then, an alumina film was formed on the undercoat film after oxidation. The alumina film was formed by the reactive sputtering method, i.e., by heating the base material to a temperature similar to that in the oxidation step (750° C.) in an argon and oxygen environment while applying a pulsed DC power of about 2.5 kW respectively to the two sputtering cathodes 6 each with an aluminum target shown in FIG. 1. The protective alumina film was formed at a discharge condition in a so-called transition mode, while controlling the discharge voltage and the flow rate ratio of argon/oxygen by using plasma emission spectroscopy. A protective alumina film having a thickness of approximately 2 μm was formed in this manner.

The crystal structure of the alumina film was identified by analyzing the surface of the alumina film obtained by using a thin-film X-ray diffractometer. As a result, only diffraction peaks indicating α-alumina were observed as the diffraction peaks indicating alumina, confirming that the alumina film obtained by the method was an alumina film predominantly containing α-alumina.

Then, the alumina film was observed under a SEM (scanning electron microscope). The surface micrograph is shown in FIG. 2. FIG. 2 reveals that the alumina film obtained by the method is superior in crystallinity and has crystal grains definitely distinguishable, because of drastic crystal growth even at a film thickness of approximately 2 μm. The alumina film in such a surface state seems to have an increased surface roughness.

Then, the cross section of the alumina film was observed under a TEM (transmission electron microscope), and the film was subjected to an EDS analysis. The result is shown in FIG. 3.

FIG. 3 reveals that the film consists of three layers: from the base material, a CrN film, a chromium oxide ($Cr_2O_3$) layer having a thickness of 30 to 40 nm obtained by oxidation of the CrN film surface, and an alumina film. The results by electron diffraction pattern confirmed that the alumina and chromium oxides are both in the corundum structure.

The micrograph of FIG. 3 shows that the alumina crystal grains constituting the alumina film are grown larger as they become closer to the film surface. Increase in the surface roughness of alumina film due to growth to coarse crystal grains may cause problems, depending on applications. For example, when the film is applied to a cutting tool, the work material may be more likely adhered to the alumina film surface.

The present invention was completed under the circumstances above, and an object thereof is to provide a protective alumina film containing fine crystal grains of alumina in the α-crystal structure, and a method of producing the protective alumina film.

SUMMARY OF THE INVENTION

The protective alumina film according to the present invention is a protective film mainly containing alumina in the α-crystal structure, characterized in that one or more regions containing additionally an element other than aluminum formed along the planes in the direction almost perpendicular to the thickness direction of the protective film are present intermittently in the thickness direction inside the protective film (hereinafter, referred to as the "first protective alumina films"). The element other than aluminum is preferably a metal element capable of forming its oxide, and use of Cr and/or Fe as the metal element is particularly preferable.

The first protective alumina film preferably has the mixed regions separated from each other at a distance of 0.5 μm or less, and the total thickness of the mixed regions is preferably 10% or less with respect to the thickness of the protective film. In addition, the content of the element other than aluminum is preferably 2 atom % or less in the entire protective film.

The present invention also specifies a protective alumina film in another configuration, and the protective alumina film is a protective film mainly containing alumina in the α-crystal structure, characterized in that alumina layers mainly in the α-crystal structure are laminated alternately with layers of an oxide in the corundum structure (excluding alumina, the same shall apply hereinafter) or layers of the oxide in the corundum structure mixed with the metal of the oxide (hereinafter, referred to as the "second protective alumina film").

The oxide in the corundum structure is preferably $Cr_2O_3$, $Fe_2O_3$ or a mutual solid solution of two or more oxides selected from the group consisting of $Cr_2O_3$, $Fe_2O_3$ and $Al_2O_3$; the thickness of the oxide layer in the corundum structure or the mixed layer of the oxide in the corundum structure and the metal of the oxide is preferably 2 nm or more; and the total thickness of the oxide layers in the corundum structure or the mixed layers of the oxide in the corundum structure and the metal of the oxide is preferably 10% or less with respect to the thickness of the protective film. In addition, the thickness of the alumina layer mainly in the α-crystal structure is preferably 0.5 μm or less.

The present invention specifies a protective alumina film in yet another configuration, and the protective alumina film is a protective film mainly containing alumina in the α-crystal structure, characterized by being a laminate film of alumina layers mainly in the α-crystal structure substantially different in crystal nucleus (hereinafter, referred to as the "third protective alumina film"). The thickness of the alumina layer mainly in the α-crystal structure is preferably 0.5 μm or less.

The term "substantially" means that the third protective alumina film include the case when a newly laminated alumina layers mainly in the α-crystal structure is completely different in crystal nucleus from the undercoat alumina layer mainly in the α-crystal structure as well as the case when a newly laminated alumina layer mainly in the α-crystal structure contains a small amount of regions wherein the crystal nuclei of the undercoat alumina layer mainly in the α-crystal structure are grown as they are.

The present invention specifies a method of producing the protective alumina films, and the method of forming the first or second protective alumina film (forming a mutual solid solution of an oxide excluding alumina in the corundum structure and $Al_2O_3$ as the oxide layer in the corundum structure) on a base material (including a base material having an undercoat film previously formed) is characterized by depositing an element other than aluminum intermittently while forming alumina layers mainly in the α-crystal structure during formation of the protective alumina film.

The method of forming the second protective alumina film (forming an oxide excluding alumina in the corundum structure as the oxide layer in the corundum structure) on a base material (including a base material having an undercoat film previously formed) is characterized by forming alumina layers mainly in the α-crystal structures and oxide layers in the corundum structure (excluding alumina) alternately during formation of the alumina film.

The method of forming the third protective alumina film on a base material (including a base material having an undercoat film previously formed) is characterized by forming alumina layers mainly in the α-crystal structure intermittently during formation of the alumina film.

BRIEF DESCRIPTION OF THE DRAWINGS

FIG. 6A is a schematic cross-section explanatory drawing showing the configuration of a first protective alumina film, while

FIG. 7A is a schematic cross-section explanatory drawing showing the configuration of a second protective alumina film, while

BEST MODE FOR CARRYING OUT THE INVENTION

Under the circumstances above, the inventors studied the methods of forming a protective alumina film mainly containing fine alumina in the α-crystal structure on a base material such as cemented carbide or on a base material having a hard film formed as an undercoat film, for example, of TiAlN, at relatively lower temperature.

Figure 3:
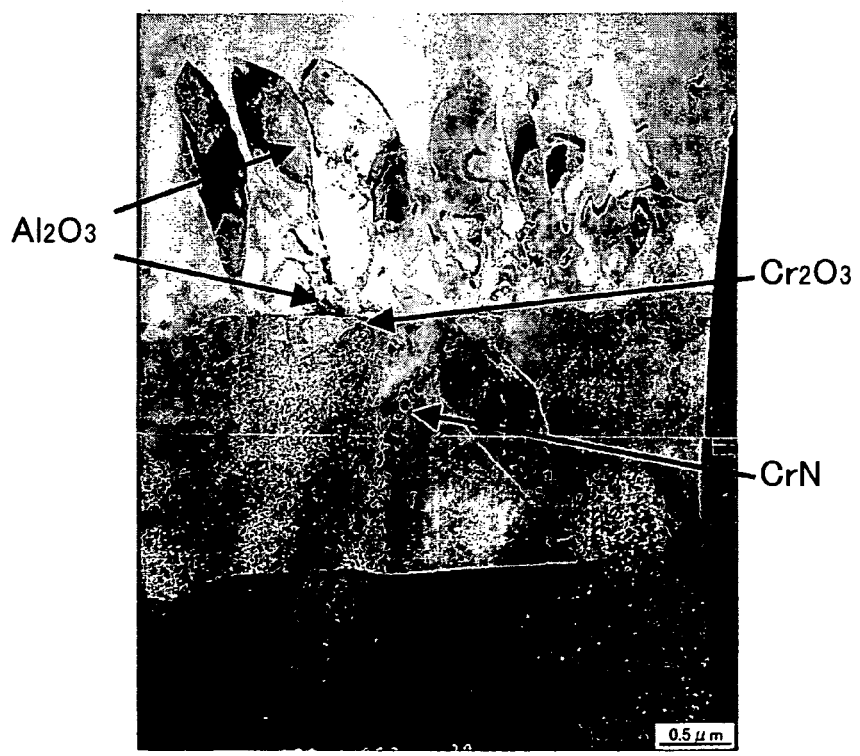
FIG. 3 is a TEM observation micrograph (magnification: 20,000 times) showing the cross section of an alumina film obtained by a conventional method.
Figure 4:
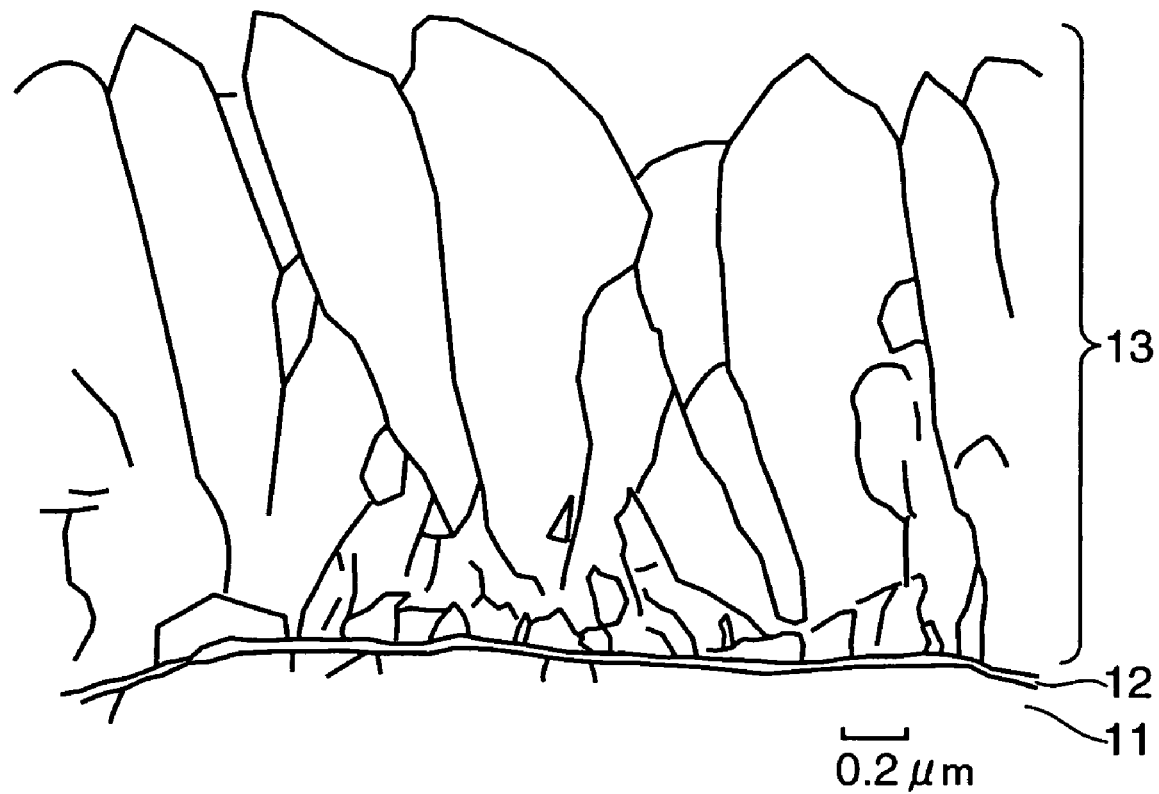
FIG. 4 is a schematic drawing of the crystal grains in FIG. 3.

FIG. 4 is a schematic view illustrating the crystal grains of α-alumina drawn with the seemingly grain boundary lines extracted from the TEM micrograph shown in FIG. 3.

FIG. 4 above shows that crystal grains of α-alumina 13 grow larger as the film is thickened and the width of the crystal grains reaches up to approximately 0.5 μm in the region close to the alumina film surface, which in turn indicates that the alumina film has a surface irregularity of as large as approximately 0.5 μm.

However, observation of FIG. 4 in detail reveals that relatively smaller alumina crystal grains are formed on the chromium oxide layer 12 in the initial phase of the crystal grain growth, and thus, the alumina crystal grains in the alumina film will remain fine in size and the alumina film surface smooth, if the alumina film deposition is terminated when the smaller alumina crystal grains are formed.

FIG. 4 above shows that crystal grains remain small when the thickness of alumina layer is 0.5 μm or less, and it is possible to suppress the growth to coarse crystal grains by restricting the thickness of alumina layer, more preferably, to 0.2 μm or less.

Figure 5:
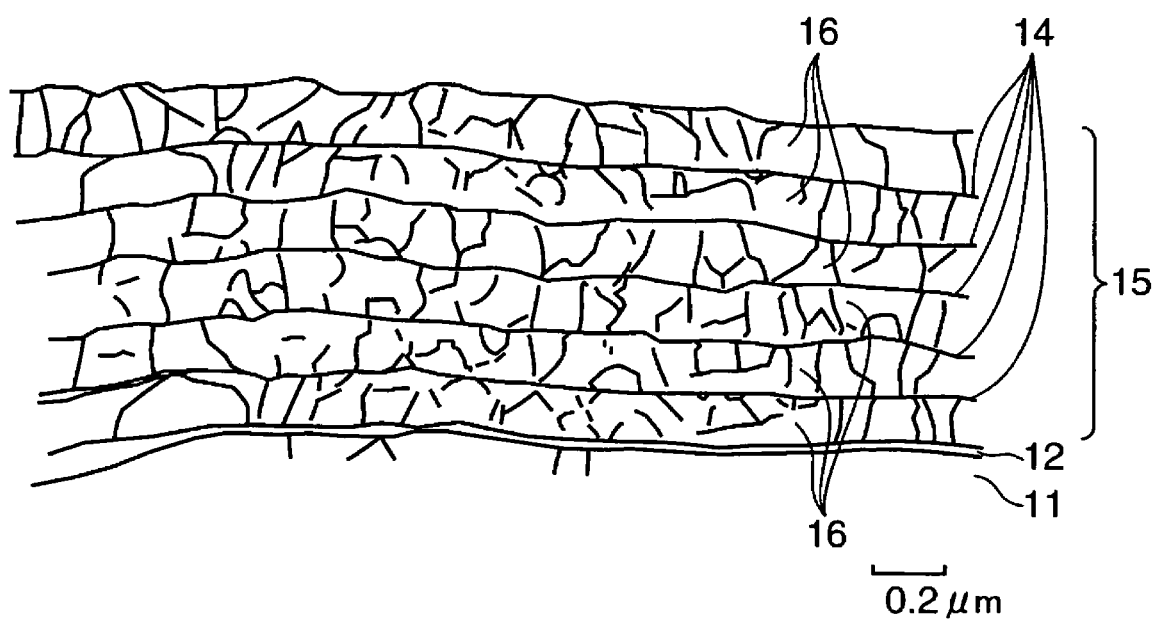
FIG. 5 is a schematic cross-section explanatory drawing showing a state in which alumina layers of fine crystal grains are laminated.

That is, as shown schematically in FIG. 5, it would be possible to obtain a protective alumina film 15 consisting of several layers of fine-crystal grain α-alumina layers 16, by forming an alumina monolayer as a fine-crystal grain thin film as described above followed by repeating to form alumina layers after bringing the crystal grain growth back to the initial phase.

Zywitzki, Takamura, et al. observed the cross section of an alumina film mainly in the α-crystal structure obtained by the PVD method and found that there was alumina in the γ crystal structure (hereinafter, referred to simply as "γ-alumina") observed in the initial fine-crystal region formed close to the interface with the base material, and reported from the observed results that the α-alumina crystals were grown from the y-alumina crystals (e.g., Surface and Coatings Technology, 1997, pp. 303 to 308, ibid., 2001, pp. 260 to 264). Accordingly, it was considered that contamination of γ-alumina was inevitable in the fine-alumina crystal grain region formed in the initial phase of growth when α-alumina is formed by the PVD method.

However, when the inventors analyzed the alumina in the region close to the interface with the $Cr_2O_3$ layer shown in FIG. 3 above by using a thin-film X-ray diffractometer, there were found only diffraction peaks indicating α-alumina and no peaks indicating γ-alumina in any area close to the interface.

That is, it was confirmed that it was possible to form a film mainly containing α-alumina even in the initial phase of crystal grain growth if it was formed under a suitable condition.

Based on these findings, the inventors conducted studies on typical examples of such a protective alumina film, for the purpose of providing a protective alumina film of fine α-alumina that is formed in the initial phase of crystal grain growth, and have found the protective alumina films of embodiments 1 to 3 described above. Hereinafter, the configuration of each protective alumina film will be described in detail.

<First Protective Alumina Film>

The first example of the protective alumina film of fine α-alumina is a protective alumina film in the configuration in which one or more regions containing an additional element other than aluminum (mixed regions) formed along the plane in the direction almost perpendicular to the thickness direction of the protective film are present intermittently in the thickness direction inside the protective film. Hereinafter, the region almost of α-alumina between the mixed regions will be referred to as an "alumina layer".

Figure 6B:
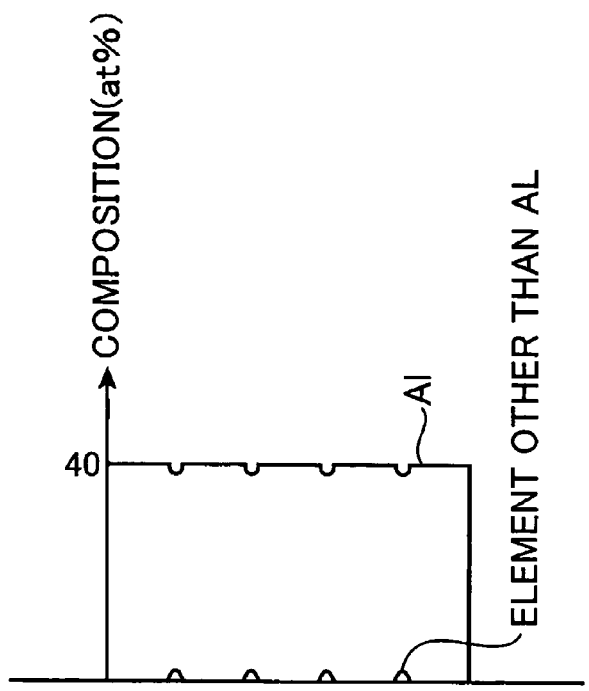
FIG. 6B is a graph showing the composition of the components of the protective film.
Figure 6A:
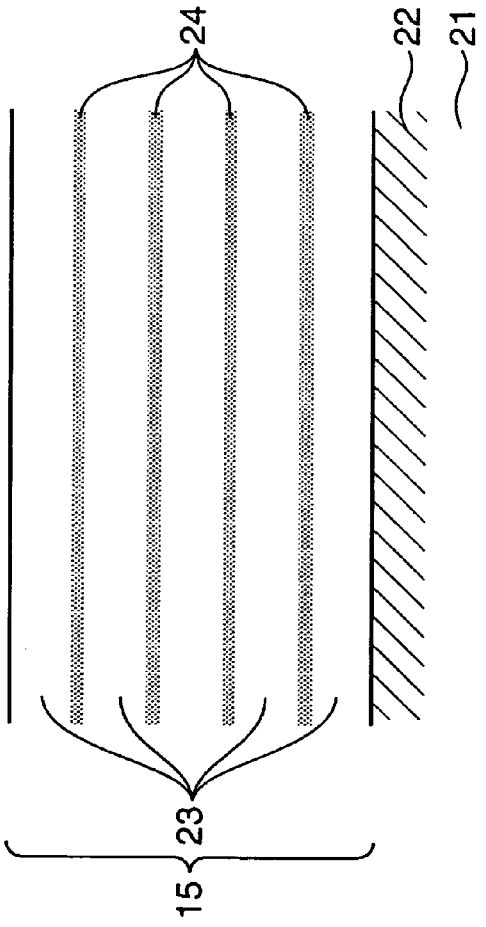

The protective films include, for example, a film having multiple mixed regions 14 formed between alumina layers 16 shown in FIG. 5, and a more schematic view of the protective film is illustrated, for example, in FIG. 6A. FIG. 6A shows that the protective alumina film 15 formed on an oxidation layer 22 obtained by oxidation of a base material or an undercoat film 21 has four mixed regions between alumina layers 23, and the protective film 15 has the composition of the components shown in FIG. 6B.

Thus, it would be possible to disturb growth of crystal grains deliberately by adding an element other than aluminum during the α-alumina crystal-growing process and generate a point to initiate growth of new crystal nuclei.

Although the following description is not intended to specify the configuration of the first protective film in detail, for obtaining finer α-alumina, the mixed regions and the like in the protective film are preferably formed as follows:

The thickness of the layer (alumina layer) between the mixed regions is preferably 0.5 μm or less. It is for the purpose of suppressing growth to coarse crystal grains as described above, and the thickness is more preferably 0.2 μm or less.

The element other than aluminum is not particularly limited, but preferably a metal element capable of forming its oxide. From the viewpoint of forming new α-alumina on the mixed region, it is also favorable to use Cr and/or Fe that form oxides having the same crystal structure as α-alumina (oxide in the corundum structure) as the metal element.

The total thickness of the mixed regions is preferably 10% or less with respect to the thickness of the protective film.

It is not necessary to set an upper limit for the thickness of the mixed regions in particular for the purpose of inhibiting the alumina crystal growth and forming new nuclei for crystal growth, but the protective film should be made mainly of α-alumina for obtaining the high-temperature stability inherent to α-alumina, and thus, the total thickness of the mixed regions in the protective film is 10% or less with respect to the thickness of the protective film for that purpose. The total thickness of the mixed regions is more preferably 5% or less, still more preferably 2% or less, with respect to the thickness of the protective film.

The content of the element other than aluminum in the mixed region is 2 atom % or less in the entire protective film. It is because addition of the element other than aluminum to the protective alumina film in a greater amount may result in adverse effects such as diffusion at high temperature. The content of the element other than aluminum in the mixed region is more preferably 1 atom % or less and still more preferably 0.5 atom % or less.

<Second Protective Alumina Film>

Another example of the protective alumina film having finer crystal grains is a protective film in which alumina layers mainly in the α-crystal structure are laminated alternately with layers of an oxide in the corundum structure (excluding alumina, the same shall apply hereinafter) or layers of the oxide in the corundum structure mixed with the metal of the oxide (hereinafter, referred to simply as "mixed layers"). Thus, it is possible to form α-alumina layers having fine crystal grains and suppress generation of γ-alumina, by laminating a layer containing an oxide in the same crystal structure as alumina in the α-crystal structure alternately with an α-alumina layer.

Figure 7A:
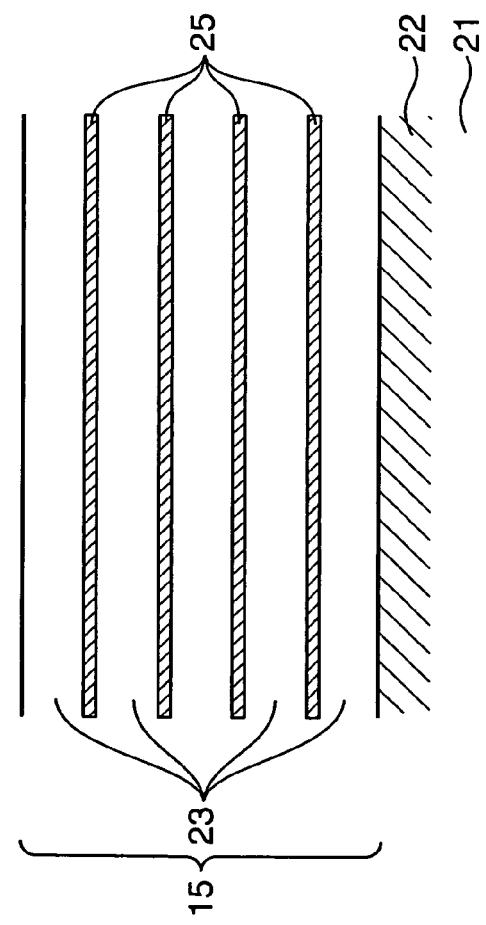

The protective films include, for example, those having multiple oxide layers or mixed layers 14 in the corundum structure respectively between the alumina layers 16, as shown in FIG. 5. FIG. 7 is a schematic view illustrating the protective layer when a $Cr_2O_3$ layer is formed as the oxide layer in the corundum structure.

Figure 7B:
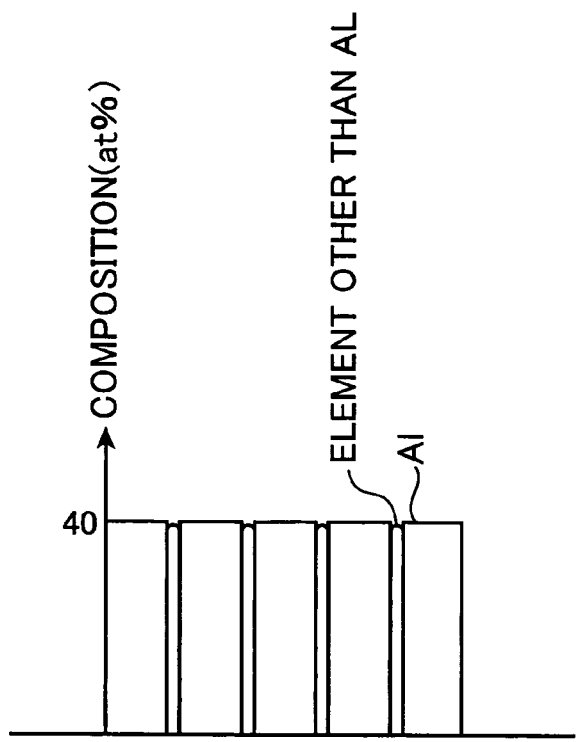
FIG. 7B is a graph showing the composition of the components of the protective film.

The protective film 15 shown in FIG. 7 is a film obtained by repeating the steps of forming a $Cr_2O_3$ layer 25 in the corundum structure on an α-alumina layer 23 during crystal growth and another α-alumina layer 23 thereon, and the protective film has the composition of the components shown in FIG. 7B.

The oxide in the corundum structure is favorably $Cr_2O_3$, $Fe_2O_3$, or a mutual solid solution of ($Cr_2O_3$ and/or $Fe_2O_3$) and $Al_2O_3$ [e.g., $(Al_{1-x}Cr_x)_2O_3$ or $(Al_{1-x}Fe_x)_2O_3$] and is not limited to the $Cr_2O_3$ described above.

The thickness of the alumina layer is favorably 0.5 μm or less. It is for the purpose of suppressing generation of coarse crystal grains similarly to the first protective film, and the thickness is more preferably 0.2 μm or less.

The oxide layer or the mixed layer in the corundum structure is preferably a single layer that has a thickness allowing independent recognition of the crystals, i.e., a thickness of 2 nm or more.

The total thickness of the oxide layer or the mixed layers in the corundum structure is preferably 10% or less with respect to the thickness of the protective film. It is because a higher rate of the oxide layers containing an element other than aluminum in the protective film may lead to adverse effects such as diffusion at high temperature. The total thickness of the oxide or mixed layers in the corundum structure is more preferably 1% or less.

<Third Protective Alumina Film>

Another example of the protective alumina film having finer crystal grains is a laminate protective film consisting of alumina layers mainly in the α-crystal structure (α-alumina layers) that are substantially different from each other in crystal nucleus. As will be described below, it is possible to obtain the laminate protective alumina film consisting of fine-crystal grain α-alumina layers that is only made of fine-crystal grain α-alumina layers, by stopping α-alumina deposition before growth of alumina crystal nuclei and then repeating deposition of α-alumina.

As described above, the thickness of the α-alumina layer is preferably 0.5 μm or less, more preferably 0.2 μm or less, for obtaining a laminate protective alumina film consisting of fine-crystal-grain α-alumina layers.

<Base Material and Undercoat Film>

The protective alumina film according to the present invention is formed on a base material or on a base material having an undercoat film previously formed, but the base material or the undercoat film is not particularly limited. Examples of the base materials for use include steel materials such as high-speed steel, cemented carbide, sintered cermet or cBN (cubic boron nitride), and sintered ceramics.

Alternatively, a film made of one or more compounds of one or more elements selected from the group consisting of the elements in Groups 4a, 5a and 6a in the periodic table, Al, Si, Fe, Cu and Y with one or more elements of C, N, B, and O, or a mutual solid solution of these compounds is preferably used as the undercoat film for deposition of the alumina in the α-crystal structure.

Typical examples of the undercoat films include films of Ti(C,N), Cr(C,N), TiAl(C,N), CrAl(C,N), and TiAlCr(C,N), i.e., of carbides, nitrides, and carbide-nitrides respectively of Ti, Cr, TiAl, CrAl, and TiAlCr; and for example, a single or multilayer film of TiN, TiC, TiCN, TiAlN, CrN, CrAlN, or TiAlCrN can be formed as the hard film on commonly used cutting tools and others.

In the present invention, the base material or the undercoat film is preferably used after surface oxidation for deposition of the protective alumina film, because the alumina layer mainly in the α-crystal structure is prepared easily.

<Production Method>

[Production Method (1)]

For the purpose of forming the first or second protective alumina film (forming a mutual solid solution of an oxide in the corundum structure excluding alumina and $Al_2O_3$ as the oxide in the corundum structure) on a base material (including a base material having an undercoat film previously formed), it is preferable to deposit an element other than aluminum intermittently while forming alumina layers mainly in the α-crystal structure during formation of the protective alumina film.

A specific example thereof is a method of forming a protective alumina film on a base material (including a base material having an undercoat film previously formed) by depositing a metal of an element other than aluminum or the oxide thereof or the like intermittently by using a sputtering source containing the metal of an element other than aluminum or the alloy or metal oxide containing the element as the target while performing reactive deposition by sputtering an aluminum target in a mixed environment of Ar and oxygen.

[Production Method (2)]

An example of the method of forming the second protective alumina film (forming an oxide in the corundum structure excluding alumina as the oxide in the corundum structure) on a base material (including a base material having an undercoat film previously formed) is a method of forming alumina layers mainly in the α-crystal structure and oxide layers in the corundum structure (excluding alumina) or mixed layers of an oxide in the corundum structure and the metal of the oxide alternately during formation of the alumina film.

A specific example thereof is a method of depositing a protective alumina film on a base material (including a base material having an undercoat film previously formed) by forming an alumina film by sputtering an aluminum target in a mixed environment of Ar and oxygen and then discontinuing the deposition of the alumina film once; forming an oxide layer in the corundum structure or a mixed layer of an oxide in the corundum structure and the metal of the oxide by sputtering using a target containing the metal for the oxide in the corundum structure (including alloy) in a mixed environment of Ar and oxygen; and then repeating deposition of the alumina film and the oxide layers in the corundum structure.

[Production Method (3)]

A specific example of the method of forming the third protective alumina film on a base material (including a base material having an undercoat film previously formed) demands intermittent deposition of alumina layers mainly in the α-crystal structure during formation of the alumina film. It includes a method of discontinuing deposition of an alumina layer once, lowering the base material temperature, and then forming another alumina layer while the base material temperature is raised again.

EXAMPLES

Hereinafter, the present invention will be described more specifically with reference to Examples, but it should be understood that the present invention is not restricted by the following Examples and all modifications that may be made in the scope of the descriptions above and below are also included in the technical scope of the present invention.

Comparative Example

A sample of cemented carbide base material having a CrN film previously formed by the AIP method was made available, and after oxidation of the sample surface, a protective alumina film was deposited thereon. The oxidation and the deposition of the protective alumina film were performed in the vacuum deposition device shown in FIG. 1 (AIP-S40 hybrid coater, manufactured by Kobe Steel).

The oxidation is performed specifically as follows: The sample (base material) 2 was connected to a planetary revolving jig 4 on the revolving table 3 in chamber 1; after evacuating the chamber 1 almost into the vacuum state, the sample 2 was heated to 750° C. (base material temperature in oxidation step) with the heater 5 placed in the center of the chamber 1 and two heaters 5 placed on the inner side wall of the chamber 1. When the temperature of sample 2 reached to a predetermined temperature, an oxygen gas was introduced into the chamber 1 at a flow rate of 300 sccm to a pressure of approximately 0.75 Pa, and the sample was oxidized while heated in the same state for 20 minutes.

Figure 1:
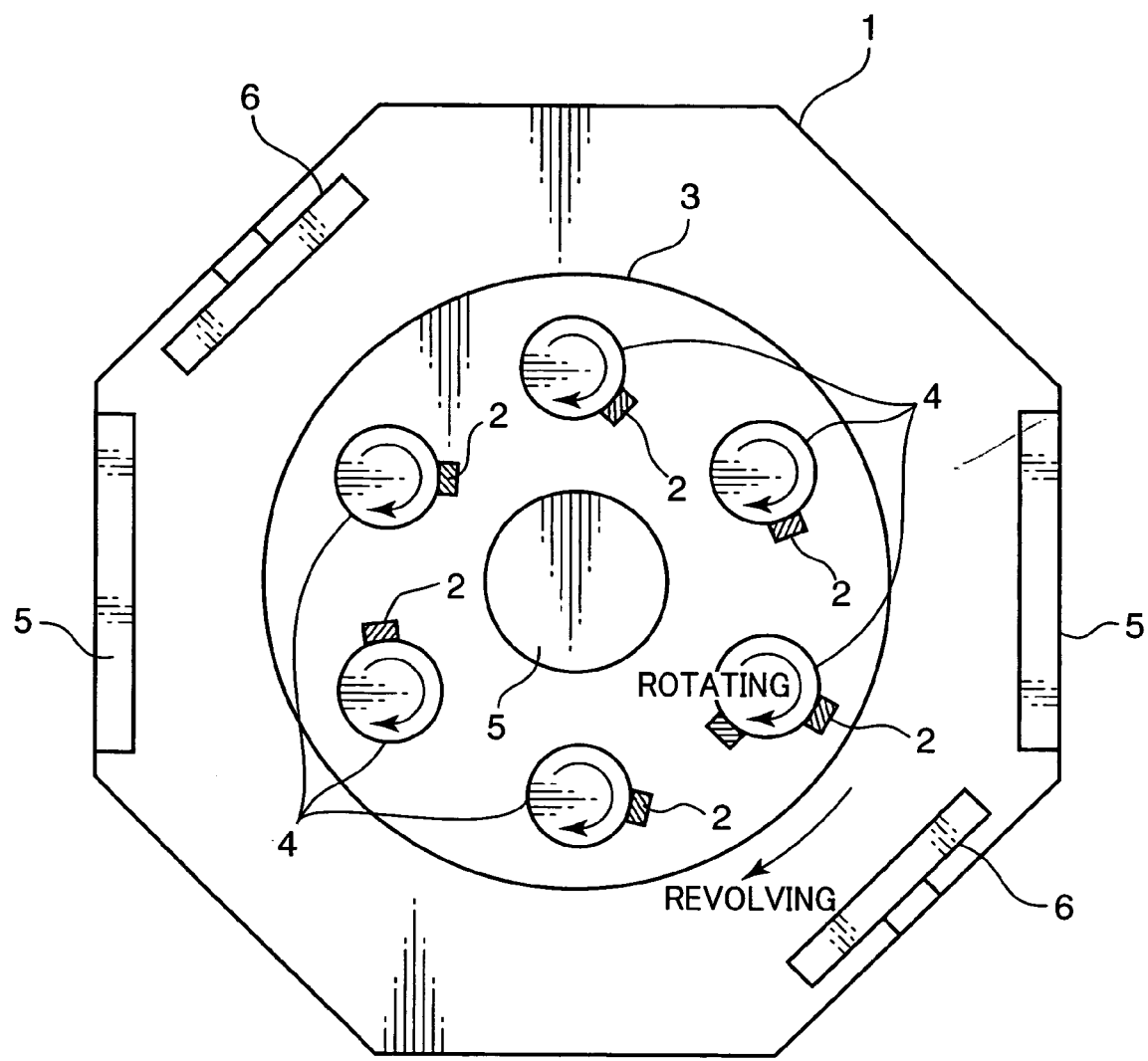
FIG. 1 is a schematic explanatory view (top view) illustrating a device used in working the present invention.
Figure 2:
FIG. 2 is an SEM observation micrograph (magnification: 8,000 times) showing the surface of an alumina film obtained by a conventional method.

The heating, the oxidation, and the alumina deposition described below were performed while revolving the table 3 shown in FIG. 1 above and rotating the planetary revolving jig 4 (base material-holding pipe) placed thereon.

Then, a protective alumina film was formed on the undercoat film after oxidation. The protective alumina film was formed by the reactive sputtering method of heating the base material to a temperature similar to that in the oxidation step (750° C.) and applying a pulsed DC power of about 2.5 kW to the two sputtering cathodes 6 each with an aluminum target in a mixed environment of Ar and oxygen. The protective alumina film was formed at a discharge condition in a so-called transition-mode, while controlling the discharge voltage and the flow rate ratio of argon/oxygen by using plasma emission spectroscopy. A protective alumina film having a thickness of approximately 2 μm was formed in this manner. The period for forming the protective alumina film was 3 hours.

Inventive Example 1

The following experiment was performed as an Inventive Examples: A protective alumina film was formed in a similar manner to the Comparative Example above, except that the protective alumina film was deposited in the following way after the one of the two aluminum targets on sputtering cathode 6 was replaced with a Cr target.

The protective alumina film was formed by depositing an alumina layer first by using only one aluminum target of the sputtering cathode 6 for 57 minutes and then applying a voltage of 500 W to the sputtering cathode 6 with a Cr target for 3 minutes while continuing deposition of the alumina layer. The steps were repeated four times, and alumina layers were formed over a period of 1 hour.

A protective alumina film having a total thickness of approximately 2 μm that mainly contains α-alumina and additionally Cr-containing mixed regions at an interval of approximately 0.35 μm from the base material surface was prepared in this manner.

Inventive Example 2

Then, a protective alumina film was formed in a similar manner to Inventive Example 1 by oxidizing the same sample, except that the Cr target used in Inventive Example 1 was replaced with a Ti target.

That is, the protective alumina film was formed by depositing an alumina layer first by using the sputtering cathode 6 with an aluminum target for 57 minutes and then applying a voltage of 500 W to the sputtering cathode 6 of Ti target for 3 minutes while continuing deposition of the alumina layer. Alumina layers were formed over a period of 1 hour, by repeating the steps four times.

A protective alumina film having a total thickness of approximately 2 μm that mainly contains α-alumina and additionally Ti-containing mixed regions at an interval of about 0.35 μm from the base material surface was prepared in this manner.

Inventive Example 3

In a similar manner to Inventive Example 1, a protective alumina film was formed by oxidizing the same sample in a similar manner to the Comparative Example above, except that an aluminum target and a Cr target were connected to the sputtering cathodes 6, as follows:

The protective alumina film was formed by forming an alumina layer first by using only one sputtering cathode 6 with an aluminum target for 55 minutes and then, after discontinuing the deposition of the alumina layer, applying a voltage of 2.5 kW to the sputtering cathode 6 with a Cr target for 5 minutes. Alumina layers were formed over a period of 1 hour, by repeating the steps for four times.

A protective alumina film having a total thickness of approximately 2 μm that mainly contains α-alumina and additionally $Cr_2O_3$ layers at an interval of about 0.35 μm from the base material surface was prepared in this manner.

Inventive Example 4

In this Inventive Example, a protective alumina film was formed in a similar manner to the Comparative Example above by oxidizing the same sample, except that the protective alumina film was formed while two aluminum targets were connected to the sputtering cathodes 6 in chamber 1, as follows:

In preparing the protective alumina film, deposition of an alumina layer was stopped at a point of 30 minutes after start by terminating sputtering and heating by heaters 5. The heaters 5 were turned on after 10 minutes, and then sputtering was resumed after 5 minutes from then, while supplying the environmental gas ($Ar+O_2$) used during sputtering above at the same flow rate. Alumina layers were formed over a period of 30 minutes, by repeating the steps four times.

The protective film obtained is a laminate film having a total thickness of approximately 2 μm that contains alumina layers substantially different in crystal nucleus at an interval of approximately 0.35 μm from the material surface.

<Thin-Film X-ray Diffraction Analysis and SEM Observation of the Protective Alumina Film Obtained>

The surface of each protective alumina film thus obtained was analyzed with a thin-film X-ray diffractometer, and the crystal structure of each protective alumina film was identified. In addition, the surface of each protective alumina film was observed under a SEM. The results are summarized in Table 1.

TABLE 1

| | X-ray diffraction result | Surface smoothness |
|---|---|---|
| Comparative Example | α-Alumina + fine α-$Cr_2O_3$* | Many crystal grains in the order of 0.5 to 1 μm |
| Example 1 | α-Alumina | Smooth |
| Example 2 | α-Alumina | Smooth |
| Example 3 | α-Alumina + fine α-$Cr_2O_3$* | Smooth |
| Example 4 | α-Alumina | Smooth |

*In the oxide-containing layer

As apparent from Table 1, in the protective alumina film mainly containing α-alumina formed in the Comparative Example, i.e., formed by a conventional method, the alumina crystal grains are larger and coarse. On the contrary, it is obvious that the alumina in each of the protective alumina films according to the present invention of Inventive Examples 1 to 4 is almost all in the α-crystal structure and in minute crystal grains and has a smooth surface, due to suppression of the grow of crystal grains.

INDUSTRIAL APPLICABILITY

The present invention in the configuration described above provides a protective alumina film mainly containing α-alumina and alumina fine-crystal grains that can be expected to be potentially superior in wear and heat resistances to those traditionally available, and a method of producing the same.

The invention claimed is:

1. A protective alumina film mainly comprising alumina in the α-crystal structure, wherein
   the protective alumina film is formed on an oxidation layer present on a surface of a base material or of an undercoat film previously formed on the base material,
   the protective alumina film comprises one or more regions comprising additionally an element other than aluminum, the element other than aluminum being at least one of Cr and Fe capable of forming an oxide thereof,
   the region is formed along the planes in the direction almost perpendicular to the thickness direction of the protective film, and
   the region is present intermittently in the thickness direction inside the protective film to form a layer between alumina layers mainly in the α-crystal structure,
   wherein the formed layers comprising an additional element other than aluminum have a total thickness of 10% or less with respect to a thickness of the protective film, and a thickness of each of the alumina layers is 0.5 μm or less.

2. The protective alumina film according to claim 1, wherein the total thickness of the formed layers comprising an additional element other than aluminum is 2% or less with respect to the thickness of the protective film.

3. The protective alumina film according to claim 1, wherein the content of the element other than aluminum is 2 atom % or less in the entire protective film.

4. The protective alumina film according to claim 1, wherein the region forming the layer between the alumina layers mainly in the α-crystal structure comprises an oxide in the corundum structure.

5. The protective alumina film according to claim 4, wherein the oxide in the corundum structure is a mutual solid solution of $Al_2O_3$ and at least one selected from the group consisting of $Cr_2O_3$ and $Fe_2O_3$.

6. The protective alumina film according to claim 1, wherein
   the protective alumina film comprises an alumina layer mainly in the α-crystal structure between the formed layers comprising an additional element other than aluminum.

7. A method of forming the protective alumina film according to claim 1 on a base material or on an undercoat film previously formed on the base material, comprising,
   subjecting the base material or the undercoat film to an oxidation treatment to form the oxidation layer on a surface of the base material or of the undercoat film, and
   depositing an element other than aluminum intermittently while forming alumina layers mainly in the α-crystal structure during formation of the protective alumina film on the oxidation layer.

* * * * *